May 7, 1968 R. MONTMORY 3,382,099
PROCESS FOR THE EPITAXIAL GROWTH OF SEMICONDUCTOR LAYERS ON METAL SUPPORTS
Filed April 20, 1964
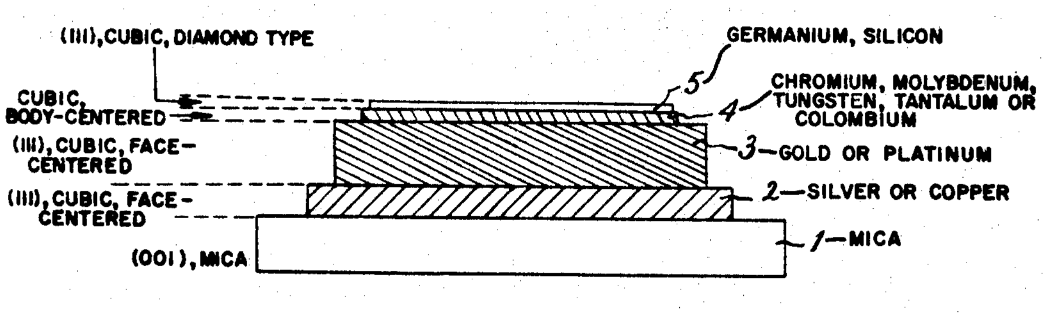
INVENTOR
ROBERT MONTMORY
BY [signature]
ATTORNEY United States Patent Office 3,382,099
Patented May 7, 1968

3,382,099
PROCESS FOR THE EPITAXIAL GROWTH OF SEMICONDUCTOR LAYERS ON METAL SUPPORTS

Robert Montmory, Grenoble, France, assignor to Centre National de la Recherche Scientifique, Paris, France, a French body corporate Filed Apr. 20, 1964, Ser. No. 360,925
Claims priority, application France, Apr. 23, 1963, 932,543
3 Claims. (Cl. 117—215)

ABSTRACT OF THE DISCLOSURE

A process for epitaxial growth of semiconductor layers on a mica split support cleaved along the (001) plane by first epitaxially depositing cubic face-centered silver or copper (111), thereover epitaxially depositing cubic face-centered gold or platinum (111), thereover epitaxially depositing body-centered metals such as chromium, molybdenum, tungsten, tantalum or columbium, selectively dissolving away the first layer (111) while separating the mica split and thereafter epitaxially depositing diamond-type cubic semiconductor such as germanium or silicon on the remaining cubic body-centered layer.

This invention relates to a process for the epitaxial growth of monocrystalline wafers or layers of semiconductor substances on a metal support.

The base member at present used for conventional semiconductor devices, such as diodes, transistors, integrated circuits, micrological elements, solar cells and so on, is a wafer of a semiconductor member cut from a drawn monocrystalline rod or bar. The technique of epitaxial growth, when used at all, is used merely to apply extra layers of a semiconductor material to a base material which is a monocrystalline wafer of the same semiconductor material (growth of germanium on germanium or silicon on silicon) or a monocrystalline wafer of another semiconductor material (growth of germanium on silicon for example).

It is an object of this invention to produce semiconductor wafers, which can readily have a large surface area, by epitaxial growth of a semiconductor, such as germanium or silicon, on a metal support. The resulting epitaxial wafers can be given all the conventional doping, activation and masking treatments, and treatments for the formation of junctions and of ohmic or rectifying contacts such as are conventional in the semiconductor art.

Research by the applicant has shown that a semiconductor material having a crystalline lattice of the cubic-diamond kind, such as germanium or silicon, can be deposited epitaxially on a metal crystallizing in the body-centered cubic lattice such as chromium or molybdenum or tantalum or tungsten or columbium, if the (111) plane is used as the boundary plane for the two substances. Epitaxy can be performed more readily if the side of the body-centered cubic lattice is near 2.84 A. The following list gives the size of the side of the cubic lattice spacing for some metals having a body-centered cubic lattice:

| | Angstroms |
|---|---|
| Chromium | 2.88 |
| Molybdenum | 3.14 |
| Tungsten | 3.15 |
| Tantalum | 3.28 |
| Columbium | 3.30 |

It is known that a metal having a face-centered cubic lattice, such as silver or copper or gold or platinum, can be deposited epitaxially on a mica substrate, since mica crystallizes in the monoclinical system and has a perfect (001) cleavage plane in which the symmetry is a hexagonal symmetry. This same hexagonal symmetry is found in the (111) plane of a metal having a face-centered cubic lattice.

Research by the applicant has also shown that a metal having a body-centered cubic lattice such as chromium, can be epitaxially deposited on a metal having a face-centered cubic lattice such as silver or copper or gold or platinum, whereby chromium thin monocrystalline plates are produced.

The invention provides a process for preparing semiconductor layers on a metal support wherein, starting from a mica substrate, a first layer of a metal having a face-centered cubic lattice, such as silver or copper or gold or platinum, is deposited epitaxially on the mica substrate, a second layer of a body-centered cubic lattice metal, such as chromium or molybdenum or tungsten or tantalum or columbium, is deposited epitaxially on the first layer, the first layer is selectively dissolved with the exclusion of the second layer, to separate the mica substrate from the second layer, and a third layer of a semiconductor substance having a cubic-diamond lattice, such as germanium or silicon, is deposited epitaxially on the second layer.

Since semiconductor epitaxial layers of germanium and silicon are formed at temperatures of from 800 to 1000° C., mica becomes unstable and begins to break down at such temperatures and must be removed before the last-mentioned layers are deposited. To this end, the first layer of a metal having a face-centered cubic lattice is replaced by two layers one above another of such metals, the first layer being of a metal such as silver or copper, giving an epitaxial deposit on mica at a temperature below the temperature at which mica becomes unstable, the last-mentioned metal being adapted to be dissolved by an acid, while the second of the two layers one above another is of a metal, such as gold or platinum, which such acid does not attack. With this arrangement of layers, the mica substrate can be separated from the stack of epitaxial layers, before the semiconductive epitaxial layer is deposited, by the first silver or copper layer being dissolved, the second gold or platinum layers staying unattacked and protecting the subsequent layers.

The invention will hereinafter be described in detail with reference to a complete practical embodiment, reference being made to the single figure which forms the accompanying drawing and which shows the substrate and the sequence of the epitaxial layers. In this figure the thickness of the layers is amplified with respect to the transverse dimension.

The starting element is a mica sliver 1 to which an epitaxial film 2 of silver is first applied by evaporation of silver in a high vacuum of from $10^{-7}$ to $10^{-8}$ mm. Hg. The evaporation rate is some 2 A./sec. and the temperature of the mica support is about 300° C. The thickness of the silver layer is about 1000 A. A second epitaxial film 3, this time of gold, is deposited, to a thickness of approximately 2000 A., in the same vacuum unit and in the same experimental conditions. The orientation of the two deposits on the mica is such that the (111) plane of the silver and of the gold is parallel with the (001) plane of the mica and that the $(\overline{110})$ row of the silver and the (010) row of the mica are coincident. The gold and silver deposits must be free from twins and double position crystallities; this requirement can be met by appropriate control of the temperature of the support and of the evaporation rate to the values hereinbefore specified.

The monocrystalline gold layer 3 serves as support for an epitaxial film 4 of chromium which is a few hundred A. thick and which has a parallel orientation and which is prepared by sublimation of chromium in the same vacuum unit as previously. An epitaxial deposit 5 of germanium or silicon is then prepared either by ultra-vacuum vapour coating or by some conventional chemical decomposition method, for instance, from trichlorogermane or trichlorosilane.

Since the formation temperature of the layer 5 is some 800 to 1000° C., the mica must, because of its thermal instability, be removed before the layer 5 is formed. As described in the opening part hereof, this instability of the mica is the reason for providing the two epitaxial layers of face centered cubic lattice metals, i.e., a layer of silver or copper, and a layer of gold or platinum—although in theory a single layer should be sufficient.

In the present case, the mica is removed by the silver being dissolved by separation of the gold-chromium layer by flotation after the silver has been attacked with a dilute acid. More specifically, the stack comprising the sliver or film of mica 1 and layers 2, 3, 4 is dipped slowly into a nitric acid bath and at a slight inclination with the surface of the bath. The silver layer 2 dissolves, the mica drops to the bottom of the bath and the layers 3, 4 float on the bath surface. The gold-chromium layer is then heat-treated under vacuum at 600° C. for several hours to remove lattice defects, such as dislocations, stacking defects and so on, before the semiconductive layer 5 is deposited.

The monocrystalline deposits prepared by the process according to the invention can be of considerable size, for instance, 50 mm. x 50 mm. They can have any geometric characteristics desired for use in electronic devices, such as diodes, transistors, integrated circuits, solar cells or the like, to which end appropriate masks are used in their preparation. The germanium or silicon monocrystal can be as much as one micron thick if prepared by vapour coating in vacuo, and several tens of microns thick if prepared by a chemical decomposition process.

As previously stated, the gold or platinum layer 3 can be omitted and a chromium layer 4 can be deposited directly by epitaxy on the silver layer 2, in which case, however, some substance must be used which dissolves silver but not chromium.

What I claim is:

1. Process for the epitaxial growth of semiconductor layers on a metal support comprising the steps of taking as a substrate a mica split cleaved along a (001) plane, epitaxially depositing a first layer of a face-centered cubic lattice metal on said mica substrate, epitaxially depositing a second layer of a body-centered cubic lattice metal on said first layer, selectively dissolving said first layer with the exclusion of the second layer to separate the mica substrate from the second layer and epitaxially depositing a third layer of a diamond-type cubic lattice semiconductor material on said second layer.

2. Process for the epitaxial growth of semiconductor layers on a metal support comprising the steps of taking as a substrate a mica split cleaved along a (001) plane, epitaxially depositing on said mica substrate a first layer of a face-centered cubic lattice metal selected from the group consisting of silver, copper, gold or platinum, epitaxially depositing on said first layer a second layer of a body-centered cubic lattice metal selected from the group consisting of chromium, molybdenum, tungsten, tantalum and columbium, selectively dissolving said first layer with the exclusion of the second layer to separate the mica substrate from the second layer and epitaxially depositing on said second layer a third layer of a diamond type cubic lattice semiconductor material selected from the group consisting of germanium and silicon.

3. Process for the epitaxial growth of semiconductor layers on a metal support comprising the steps of taking as a substrate a mica split cleaved along a (001) plane, epitaxially depositing on said mica substrate a first layer of a face-centered cubic lattice metal selected from the group consisting of silver, copper, epitaxially depositing on said first layer a second layer of a face-centered cubic lattice metal selected from the group consisting of gold or platinum, epitaxially depositing on said second layer a third layer of a body-centered cubic lattice metal selected from the group consisting of chromium, molybdenum, tungsten, tantalum and columbian, selectively dissolving said first layer with the exclusion of the second layer to separate the mica substrate from the second layer and epitaxially depositing on said third layer a fourth layer of a diamond type cubic lattice semiconductor material selected from the group consisting of germanium and silicon.

References Cited

UNITED STATES PATENTS

| | | | |
|---|---|---|---|
| 2,537,256 | 1/1951 | Brattain | 117—107 X |
| 2,665,998 | 1/1954 | Campbell et al. | 117—106 X |

OTHER REFERENCES

Goswami, A.: Structures of iron and Chromium deposited on copper single crystals, In Chemical Abstracts 53, (1959).

ALFRED L. LEAVITT, *Primary Examiner.*

C. K. WEIFFENBACH, *Assistant Examiner.*